United States Patent [19]

Yeung et al.

[11] Patent Number: 5,818,250

[45] Date of Patent: Oct. 6, 1998

[54] APPARATUS AND METHOD FOR DETERMINING THE SPEED OF A SEMICONDUCTOR CHIP

[75] Inventors: Norman Kung-Po Yeung; Edward Tonguk Pak, both of Fremont; Chia-Chi Chao, Mountain View; James Euisik Yoon, Sunnyvale, all of Calif.

[73] Assignee: Silicon Graphics, Inc., Mountain View, Calif.

[21] Appl. No.: 675,849

[22] Filed: Jul. 3, 1996

[51] Int. Cl.$^6$ ................................................ G01R 31/317
[52] U.S. Cl. ........................ 324/763; 438/18; 324/765
[58] Field of Search .................................. 324/763, 765, 324/73.1, 537; 438/18

[56] References Cited

U.S. PATENT DOCUMENTS

| | | |
|---|---|---|
| 4,697,140 | 9/1987 | Saito et al. .......................... 324/73.1 |
| 5,039,602 | 8/1991 | Merrill et al. ........................ 438/18 X |
| 5,099,196 | 3/1992 | Longwell et al. ................. 324/73.1 X |
| 5,457,400 | 10/1995 | Ahmad et al. ........................... 324/763 |
| 5,619,463 | 4/1997 | Malhi .................................... 324/763 |

*Primary Examiner*—Michael Brock
*Attorney, Agent, or Firm*—Wagner, Murabito & Hao

[57] ABSTRACT

A method of testing a speed of a semiconductor chip. A test time interval is specified. A test oscillator is fabricated as part of the semiconductor under test. The test oscillator contains elements that simulate a critical path of the semiconductor chip. Hence, the test oscillator's frequency is sensitive to process variations. The number of cycles of the oscillator occurring during the test time interval is counted. Based upon this count value, the speed of the semiconductor chip under test is determined.

18 Claims, 6 Drawing Sheets

APPARATUS AND METHOD FOR DETERMINING THE SPEED OF A SEMICONDUCTOR CHIP

FIELD OF THE INVENTION

The present invention pertains to an apparatus and method for determining the speed of a VLSI chip.

BACKGROUND OF THE INVENTION

Advances in semiconductor technology have led to the development of faster, more versatile integrated circuit (IC) chips. Today, IC chips are extremely complex and are packed with high density logic. For instance, with very large scale integration (VLSI), a single chip can contain upwards of millions of transistors. Hence, a great amount of effort is spent testing and simulating the functionality of a new design to ensure that it works properly under all normal operating conditions. In addition, each newly fabricated chip is individually tested before it is shipped.

One problem encountered during test procedures is the fact that IC chips behave differently when operated at different speeds due to timing constraints and other related problems. It is difficult to reliably predict the performance of an IC chip at high speeds or frequencies. An IC chip might function perfectly at one clock speed, but the same IC chip might exhibit critical failures when operated at a higher clock speed. Indeed, the same manufacturing process often produces chips which have a wide range of maximum operating speeds. For instance, the same batch of chips might yield one chip having a 90 MHz speed, whereas the next chip can have a much higher speed of 120 MHz. This is because it is extremely difficult to control the numerous parameters and intricacies associated with the fabrication of IC chips. Some of the factors that determine a chip's operating speed include its gate oxide thickness, poly gate length, hole/electron mobilities, etc. Furthermore, variations in a chip's junction capacitance, metal resistance, silicide/salicide sheet resistance, contact/via resistance, and threshold voltage also influence the chip's operational speed. In addition, other factors during the fabrication process, may impact chip speed.

Not only is it important to test a chip's speed in terms of functionality, but it is also important from a sales perspective to sort and identify the faster chips vs. those chips having marginal speeds because faster chips command heftier premiums. Furthermore, due to the additional time and expenses incurred with testing the speed of a chip, many chip manufacturers only test the functionality of a chip, and not its speed characteristics. Hence, systems manufacturers are at risk of buying inferior chips (e.g., ASICs, memories, programmable logic, gate arrays, etc.) from chip suppliers. Timing problems are exposed only after an inferior chip is integrated into a target system (e.g., computer systems, telecommunication systems, control systems, etc.). Of course, detection of problems at this late juncture is not optimal.

Traditionally, testing a chip's speed entailed the use of large, complex, dedicated test equipment. Procuring and setting up such a test station can be very expensive. Furthermore, these test stations usually had to be specially designed and tailored to the specific type of chip that was being tested. Also, the configuration and test signals of a test station typically had to be specially adapted to specific applications. Moreover, highly skilled technicians had to be trained in its usage. Often, several such test stations were required in order to test chips in high volumes. Another disadvantage with prior art test stations is that each individual chip had to be hooked up to the test station before actual testing can begin. The actual test procedure was typically quite time-consuming and interrupted smooth-running production processes. Clearly, this prior art approach is costly, time-consuming, and cumbersome.

Thus, there is a need in the prior art for a simple, yet effective method and apparatus for testing the speed of a semiconductor chip. It would be preferable if such a method and apparatus could be used to test a wide variety of different types of semiconductor chips in a quick and cost effective manner.

SUMMARY OF THE INVENTION

The present invention pertains to an apparatus and method for testing the operational speed of a semiconductor chip. In general, a time interval is specified. A test oscillator is fabricated as part of the semiconductor chip being tested. In other words, each chip that is to be tested, contains its own, dedicated test oscillator. The test oscillator contains elements to simulate a critical path of the semiconductor chip. Although each of the chips has the same test oscillator design, the oscillators will operate at different frequencies due to variations during the fabrication process. As a result, the oscillator of a slow-running chip will have a lower frequency than that of a faster-running chip. The number of cycles of the oscillator occurring during the test time interval is counted. Based upon this count value, the speed of the semiconductor chip under test can be determined without the need for expensive, high speed test equipment.

In the currently preferred embodiment, a test value is loaded into a counter. A ring oscillator fabricated from representative elements of the chip under test, is allowed to run for a specified time interval. Each oscillator cycle causes the counter to be incremented. At the end of the time interval, the counter is checked to determine whether it has overflowed. An overflow condition indicates that chip passes or meets the test frequency corresponding to the test value. Otherwise, if there is no overflow condition, this indicates that the chip is too slow and fails the test. Thereby, the present invention offers an inexpensive, quick, and yet highly effective method for bin sorting newly fabricated chips according to their speeds.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An apparatus and method for testing the operational speed of a semiconductor chip is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
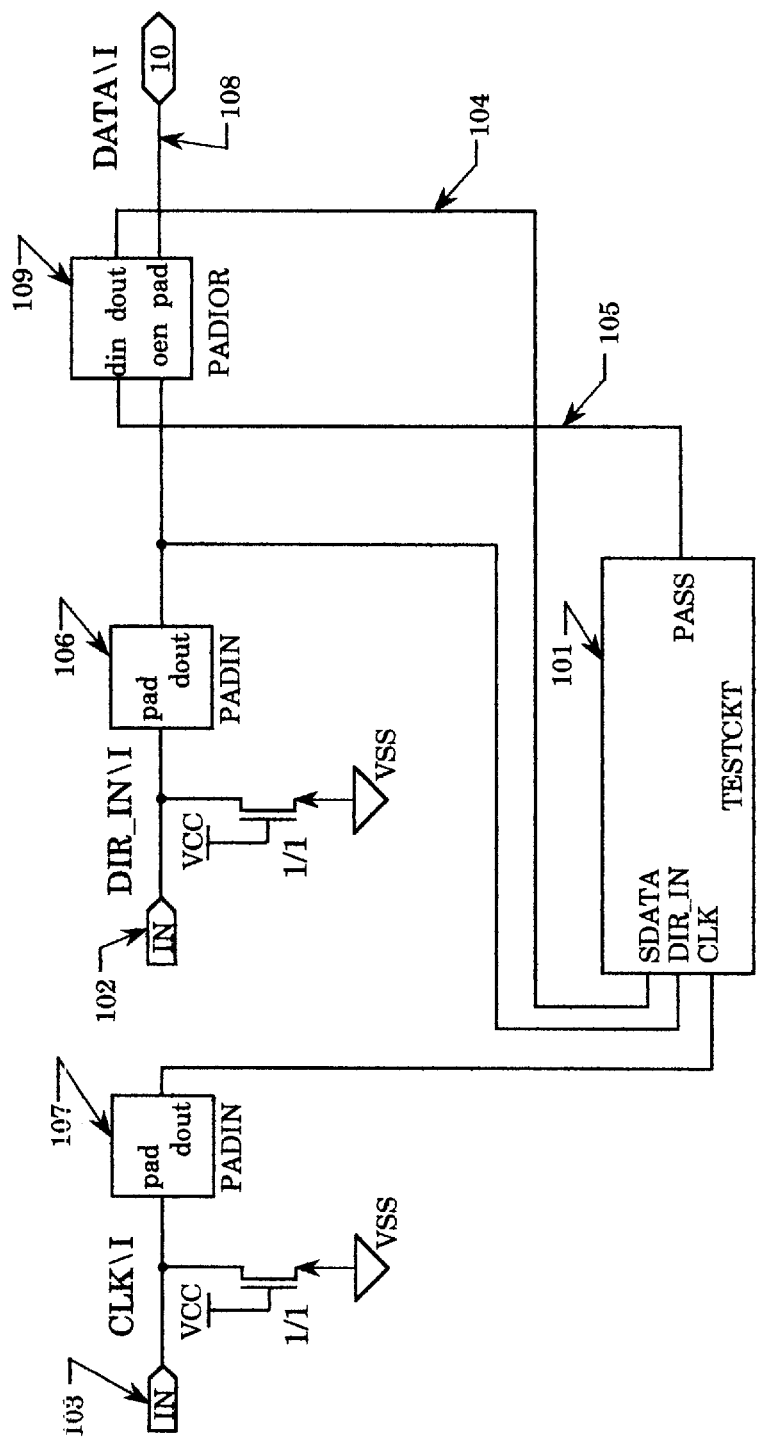
FIG. 1 shows a test circuit for testing the operational speed of a semiconductor chip according to the present invention.

Referring to FIG. 1, a test circuit for testing the operational speed of a semiconductor chip according to the present invention is shown. In the present invention, the test circuit resides within the semiconductor chip itself. In other words, each chip that is to have its speed tested, is fabricated so as to include the test circuit as an integral part of that chip. Although the test circuit consumes some logic, the amount of resources required to implement the test circuit is extremely small. Indeed, the amount of resources dedicated to the testing circuit is insignificant when compared to the total available logic. The reason why it is important to include the test circuit as part of the chip is so that the test circuit's behavior is a direct function of the chip's speed. By making the test circuit as part of the chip, the performance of the test circuit can be used to determine the speed of that particular chip. Consequently, the test circuit of a slow chip would exhibit characteristics identifying that particular chip as being slow. Conversely, a fast chip would have a test circuit that exhibits characteristics indicating that particular chip as being relatively fast. Thus, the present invention offers an inexpensive method for testing the speed of a newly fabricated semiconductor chip without the use of dedicated, expensive high-speed test equipment.

In the present invention, test circuit 101 is used to generate a pass/fail signal to indicate whether that particular chip has met specified speed requirements. The function of the test circuit 101 is described in detail below. Four interface signals are used to interface with test circuit 101. The first interface signal, DIR_IN, is used as the direction/mode control. A high signal on the DIR_IN line 102 indicates an input signal on line 108, whereas a low signal indicates an output on line 108. The CLK signal on line 103 acts as a shift clock; it also provides a test time reference. The DIR_IN and CLK signals are connected to two input pads 106 and 107, respectively. An SDATA signal on line 104 feeds the serial data input to test circuit 101. Finally, a PASS signal on line 105 is output from test circuit 101. The SDATA and PASS signals are connected to a bidirectional pad 109. Pad 109 is controlled by the DIR_IN signal. The PASS signal indicates whether the chip under test has met a specified minimum speed. A high output indicates a pass; whereas a low output indicates a fail condition. Thereby, the test circuit provides a built-in self test capability. Furthermore, this capability allows manufacturers to rapidly and efficiently sort the newly fabricated chips into different bins according to their respective speeds. In addition, the present invention eliminates the need for a separate speed test in the production flow. For companies selling computer systems, the present invention allows for greater improvement in the quality of incoming ASIC chips without an increase in production cost.

Figure 2:
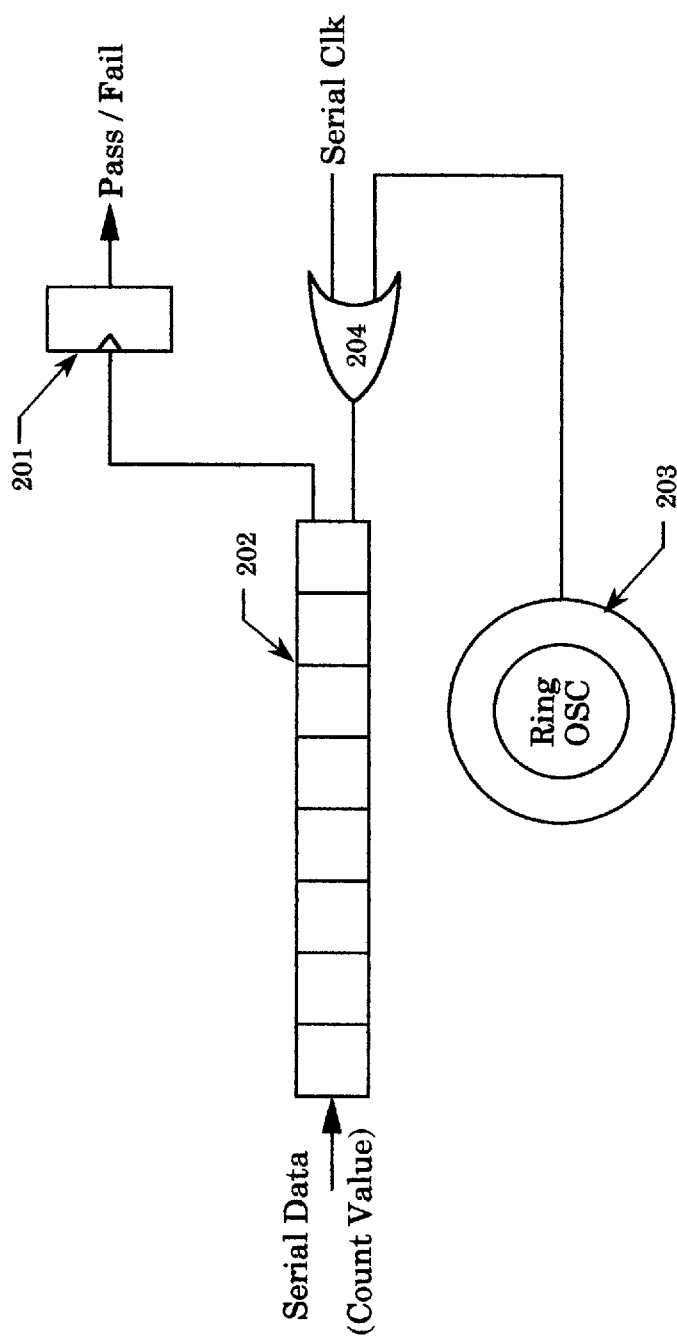
FIG. 2 shows the currently preferred embodiment of a test circuit used in determining the speed of a chip under test.

FIG. 2 shows the currently preferred embodiment of the test circuit. Initially, a serial clock is selected for input to a counter 202 via OR gate 204. An initial count value in the format of serial data is loaded into counter 202. Thereupon, the ring oscillator 203 is enabled. Ring oscillator 203 has a frequency that is some function of the chip's operating speed. If the chip under test has slow characteristics, oscillator 203 will have a lower frequency. Conversely, a fast chip will, correspondingly, have a higher oscillator frequency. The OR gate 204 now provides the output from oscillator 203 as an input to increment counter 202. Oscillator 203 is allowed to continue running for a predetermined amount of time (i.e., the test time interval). A timer (not shown) is used to measure the time interval. At the end of that time, oscillator 203 is disabled from incrementing counter 202. If at the end of this reference period, counter 202 is caused to overflow by virtue of the oscillator 203, this indicates that oscillator 203 has a high frequency. Consequently, the chip under test has passed the specified speed. Otherwise, if counter 202 does not overflow within this time period, the chip is deemed to have failed. The overflow bit from counter 202 is latched by flip-flop 201. The output signal from flip-flop 201 is used as the Pass/Fail signal. It should be noted that the test can be performed or repeated by loading different initial count values into the counter 202. This allows the test circuit to be programmed to perform tests at different speeds. By selectively entering different initial count values, one can determine, to a fair degree, the actual operating speed of the semiconductor chip.

In alternative embodiments, a counter is incremented by the oscillator. The value of the counter can be output to and monitored by test equipment. Based on the count value, one can determine the speed of the chip under test. Alternatively, the count value can be stored into a general register. The contents of the register can then be read out as part of normal data accesses. In addition, the count value can be referenced against a look-up table or equivalent index and converted into a frequency of the chip under test.

Figure 3A:
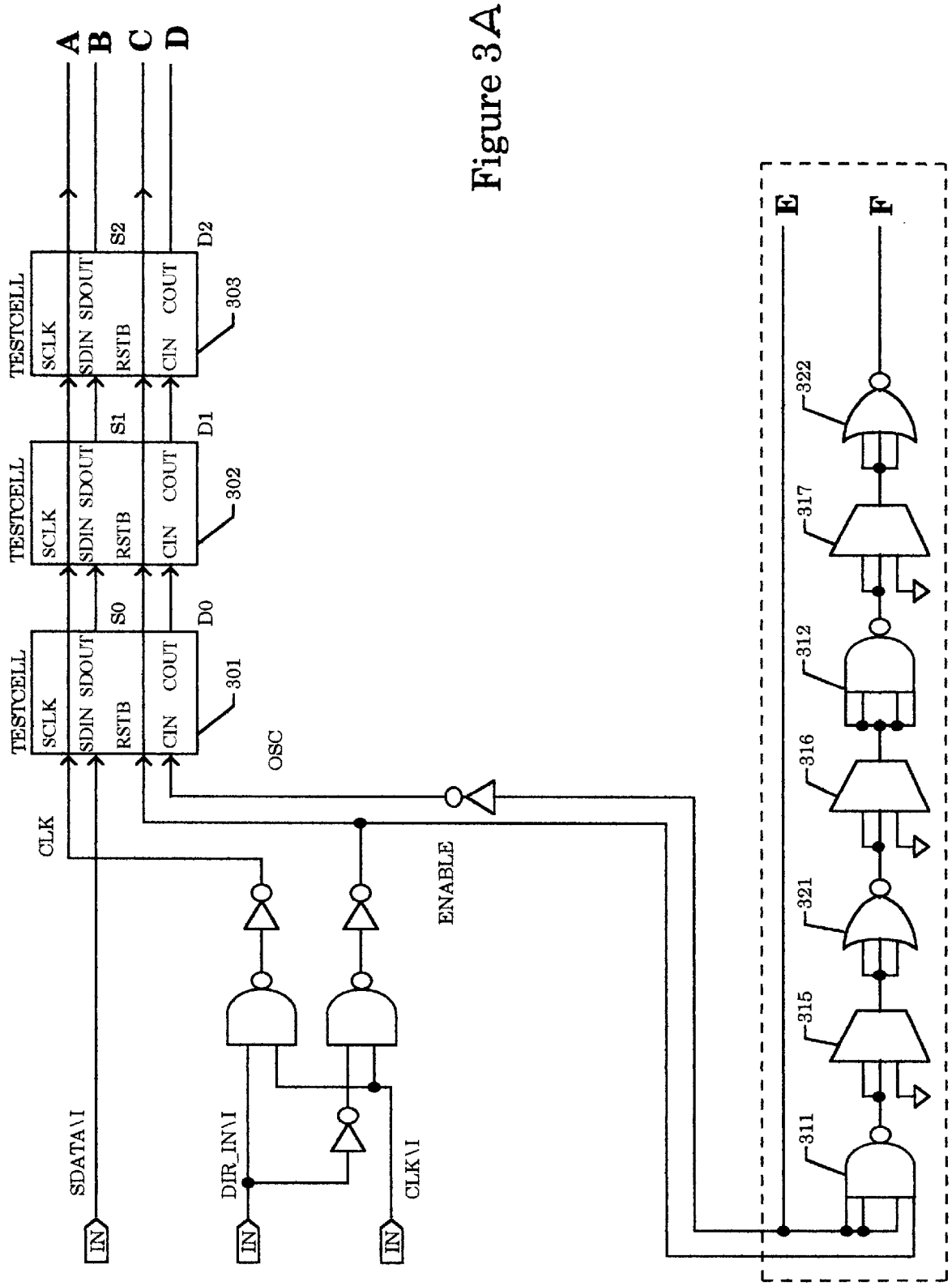
FIG. 3 shows a more detailed schematic of the test circuit.
Figure 3B:
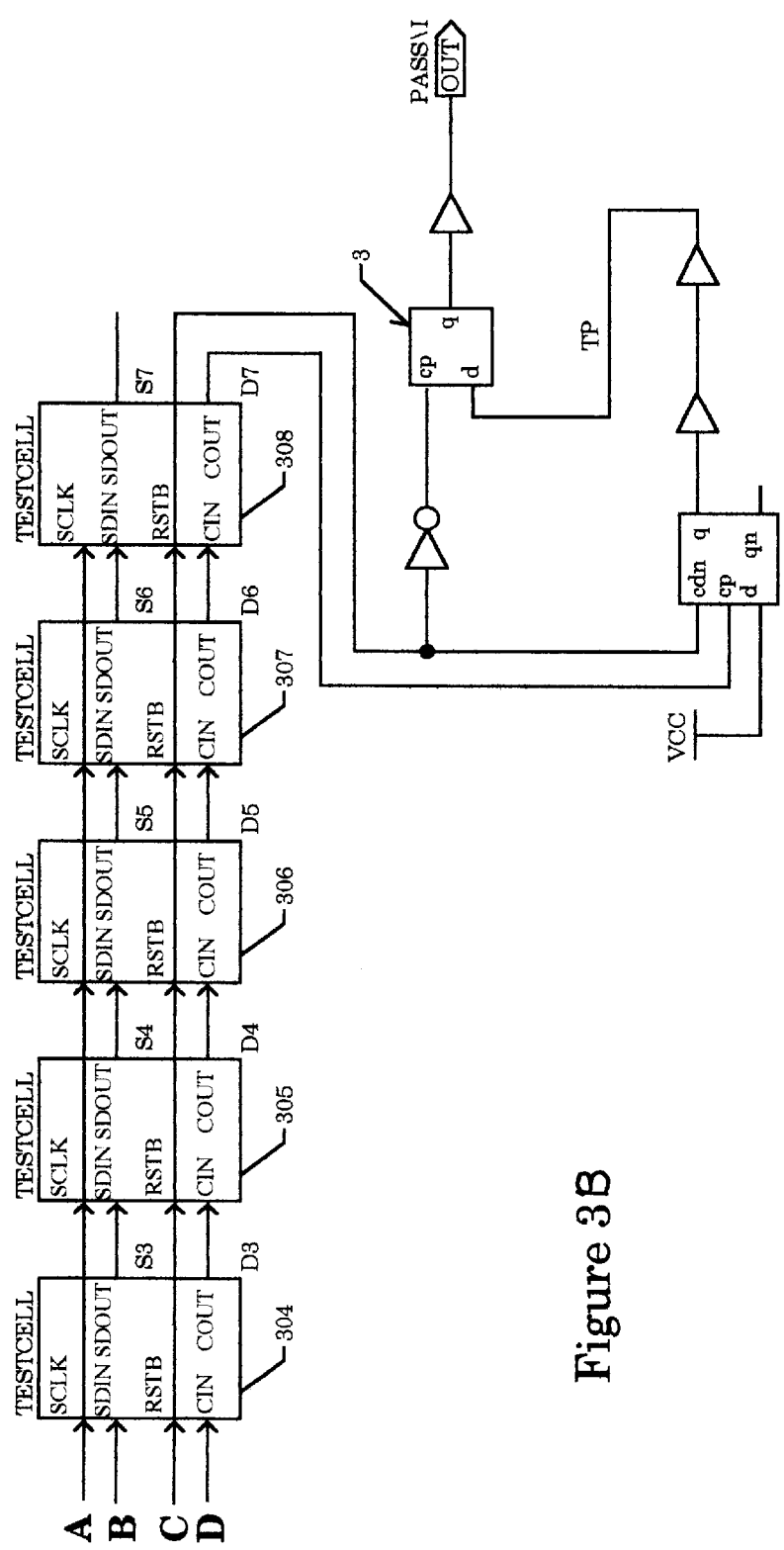
Figure 3B:
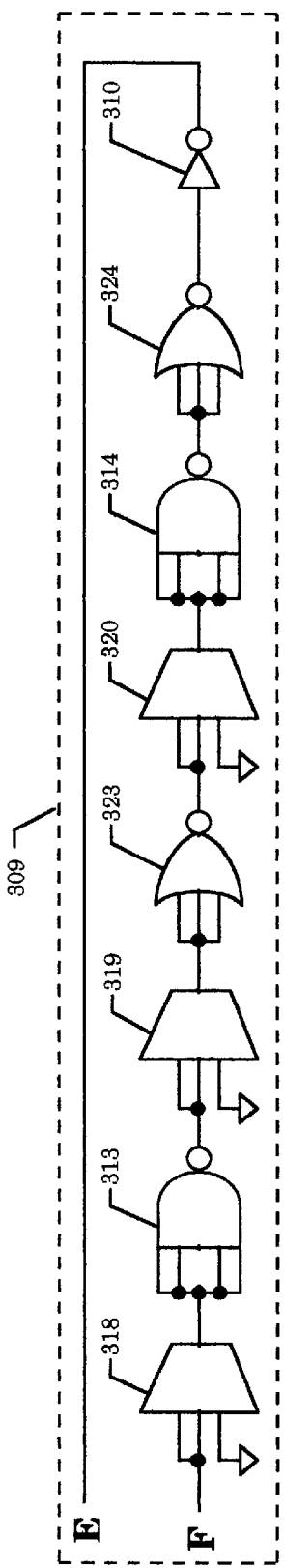

FIG. 3 shows a more detailed schematic of a test circuit. In this embodiment, the test circuit is comprised of three main components: an 8-bit shift register, an 8-bit ripple counter, and a ring oscillator. The shift register and ripple counter are represented by the eight test cells 301–308 In the input mode (i.e., DIR_IN=high), the shift register is loaded with data from the tester, whereby the most significant bit (MSB) is loaded first. Each bit is clocked on the rising edge of SCLK, which is a gated CLK. In the output mode (i.e., DIR_IN=low), the CLK signal becomes an active-high time reference. When CLK is low, the counter is initialized to the value stored in the shift register. When CLK becomes high, the incrementing counter is started by enabling the oscillator 203. When the 8-bit counter overflows, D7 (i.e., the inverted bit 7) changes from "0" to "1." Furthermore, a "1" is latched into the flip-flop and sent to the pad as the PASS signal. Thus, if the oscillator is fast enough to overflow the counter within the specified time reference, the chip passes the test. Otherwise, the chip fails the test.

The ring oscillator 309 is constructed from various types of gates to model different circuit structures that are used in the chip. Some examples include inverters 310, NAND gates 311–314, multiplexers 315–320, NOR gates 321–324, stacked-N, stacked-P, pass gates, etc. In the currently preferred embodiment, small device sizes are used in order to gain greater sensitivity to process variations. It should be noted that different combinations of elements can be used to more accurately and realistically simulate the actual critical paths of the chip under test. In addition, different numbers of such elements can be used to model the critical path. Furthermore, different types of oscillators can be used in place of the ring oscillator described above.

Figure 4:
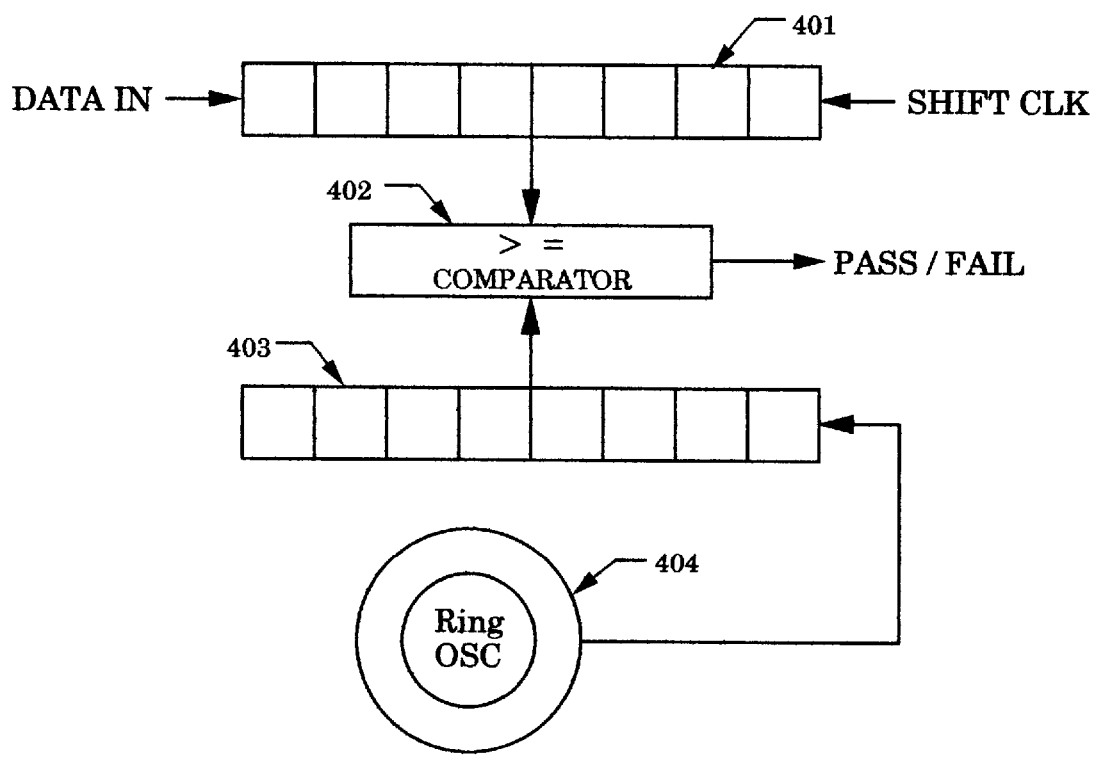
FIG. 4 shows an alternative embodiment of the test circuit.

FIG. 4 shows an alternative embodiment of the test circuit. In this alternative embodiment, an initial test value is loaded into a register 401. Counter 403 is cleared. Ring oscillator contains representative logic to model the critical path of the chip under test. Ring oscillator 404 is enabled to start incrementing counter 403. As described above, process variations unique to the chip under test will cause the ring oscillator 404 to run at a particular frequency. The ring oscillator is allowed to increment counter 403 for a specified amount of time. A higher speed will result in a larger count value in counter 403. At the end of the time limit, the value stored in counter 403 is compared by comparator 402 to the value that was loaded into register 401. If the count value is higher than or equal to the test value, a pass signal is indicated. Otherwise, a fail signal is indicated.

Figure 5:
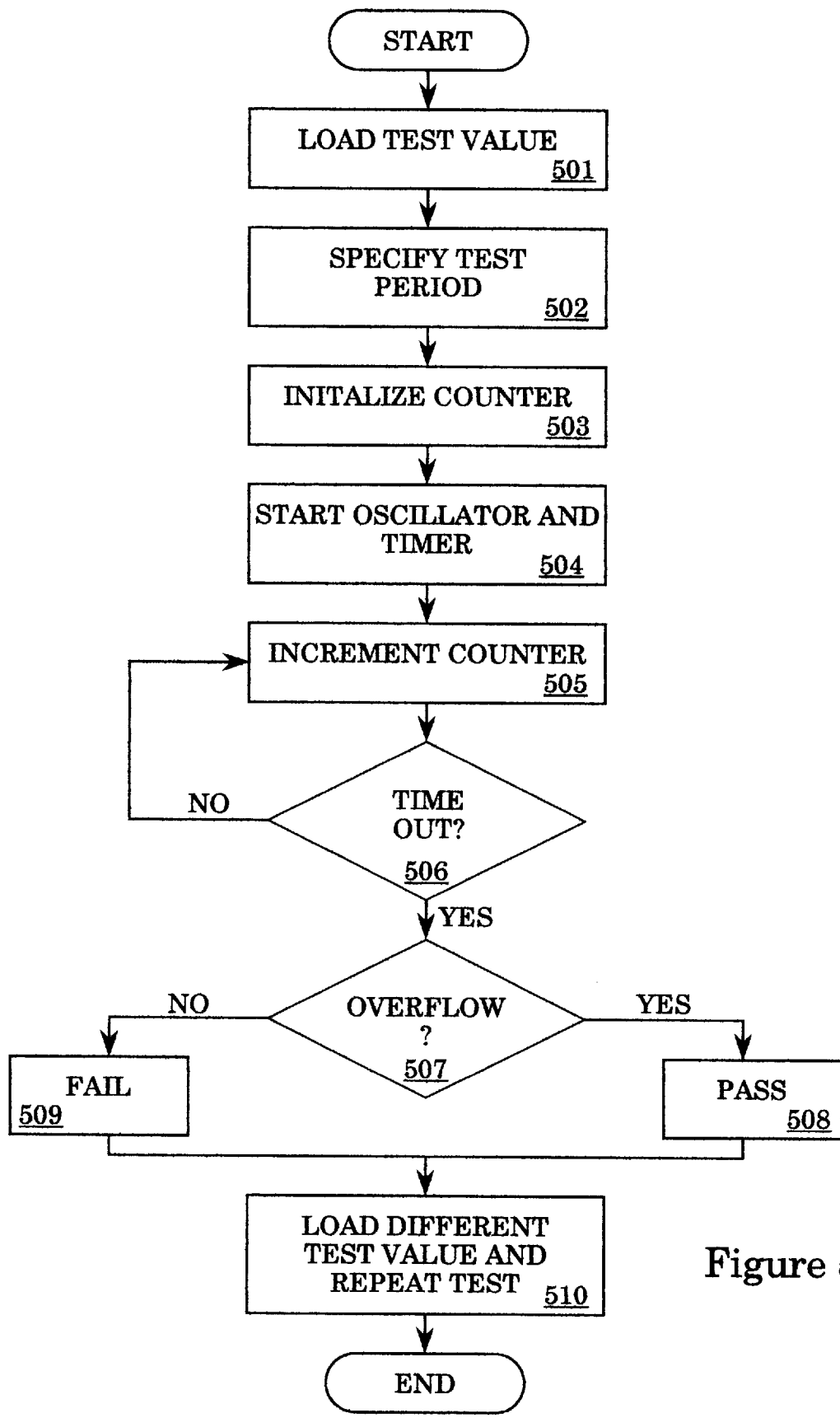
FIG. 5 is a flowchart describing the steps of the present invention for testing the speed of a semiconductor chip.

FIG. 5 is a flowchart describing the steps of the present invention for testing the speed of a semiconductor chip. Initially, a test value is loaded into memory, step 501. This test value is calculated based upon a minimum test frequency (i.e., chip speed) that the chip being tested is measured against. Next, a test time interval is specified, step 502. The test time interval is calculated so that a number of cycles run on the chip under test during this test interval is used to determine whether the chip has met the minimum test frequency threshold. In step 503, the counter is initialized to the test value. In other words, the test value is loaded into the counter. Thereupon, a timer is started. At the same time, an oscillator that is fabricated from the chip under test is also started, step 504. Each cycle of the oscillator increments the counter by one, step 505. A determination is made as to whether the test time interval has expired, step 506. If the test time interval has not expired, the oscillator continues incrementing the counter throughout the entire test time interval.

Once the test time interval expires, a determination is made as to whether the counter has overflowed, step 507. If the chip were fast enough to meet the minimum test frequency, then the oscillator would have cycled fast enough during the test time interval so as to cause the counter to overflow. Hence, an overflow condition means that the chip has passed; the chip runs at least as fast as the specified minimum test frequency. A pass condition is indicated, step 508. Otherwise, if the counter had not overflowed, the chip failed to meet the minimum test frequency, step 509. An optional step 510 involves repeating the test procedure of steps 501–509 by programming in a different initial test value. The different test value corresponds to either a higher or lower test frequency. By incrementally increasing the test value and performing the test procedure until the chip fails, one can accurately determine the maximum speed of that chip.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of testing a speed of a semiconductor chip, comprising the steps of:
   starting a time interval;
   running an oscillator, wherein the oscillator is included as part of the semiconductor chip being tested;
   ending the time interval;
   determining a number of cycles of the oscillator that had occurred during the time interval;
   determining the speed of the semiconductor chip based upon the number of cycles of the oscillator;
   loading a test value into a counter;
   incrementing the counter for each cycle of the oscillator during the time interval;
   determining whether the counter overflows at the end of the time interval, wherein the semiconductor chip passes the test if the counter had overflowed and the semiconductor chip fails the test if the counter did not overflow;
   increasing the test value repeatedly until the semiconductor chip fails the test.

2. The method of claim 1 further comprising the steps of:
   loading a test value into a memory;
   incrementing a counter for each cycle of the oscillator during the time interval;
   comparing a counter value stored in the counter to the test value, wherein the semiconductor chip passes the test if the counter value is greater than or equal to the test value and the semiconductor chip fails the test if the counter value is less than the test value.

3. The method of claim 1, wherein the oscillator is comprised of a plurality of elements that simulate a critical path of the semiconductor chip being tested.

4. The method of claim 3, wherein the elements include an inverter, a multiplexer, a NAND gate, and a NOR gate.

5. The method of claim 3, wherein the elements include a pass gate, a stacked-P structure, and a stacked-N structure.

6. The method of claim 1, wherein the oscillator is comprised of a ring oscillator.

7. The method of claim 1 further comprising the step of converting the number of cycles of the oscillator to a frequency of operation corresponding to the semiconductor chip.

8. The method of claim 1, wherein the oscillator is comprised of a plurality of elements having small device sizes which render the elements more sensitive to process variations.

9. An apparatus for testing an operational speed of the semiconductor chip, comprising:
   a timer for indicating a time interval;
   an oscillator running at a test frequency;
   a counter coupled to the oscillator, wherein the counter is incremented for each cycle of the oscillator during the time interval, wherein a faster semiconductor chip would result in more counts counted by the counter than a slower semiconductor chip;
   a circuit coupled to the counter for determining the speed of the semiconductor chip based upon a count value stored in the counter, wherein a test value is loaded into the counter and a pass condition is indicated if the counter overflows at the end of the time interval; otherwise, a fail condition is indicated if the counter does not overflow at the end of the time interval.

10. The apparatus of claim 9, wherein a test value is loaded into a memory and the semiconductor chip passes the test if the counter value is greater than or equal to the test value and the semiconductor chip fails the test if the counter value is less than the test value.

11. The apparatus of claim 9, wherein the oscillator is comprised of a plurality of elements that simulate a critical path of the semiconductor chip being tested.

12. The apparatus of claim 11, wherein the elements include an inverter, a multiplexer, a NAND gate, and a NOR gate.

13. The apparatus of claim 11, wherein the elements include a pass gate, a stacked-P structure, and a stacked-N structure.

14. The apparatus of claim 9, wherein the oscillator is comprised of a ring oscillator.

15. The apparatus of claim 9 further comprising a circuit coupled to the counter for converting the number of cycles of the oscillator to a frequency of operation corresponding to the semiconductor chip.

16. The apparatus of claim 9, wherein the oscillator is comprised of a plurality of elements having small device sizes which render the elements more sensitive to process variations.

17. A method of testing a speed of a semiconductor chip, comprising the steps of:

starting a time interval;

running an oscillator, wherein the oscillator is included as part of the semiconductor chip being tested;

ending the time interval;

determining a number of cycles of the oscillator that had occured during the time interval;

determining the speed of the semiconductor chip based upon the number of cycles of the oscillator;

loading a test value into a counter;

incrementing the counter for each cycle of the oscillator during the time interval;

determining whether the counter overflows at the end of the time interval, wherein the semiconductor chip passes the test if the counter had overflowed and the semiconductor chip fails the test if the counter did not overflow;

repeatedly increasing the test value until the semiconductor chip fails the test.

18. An apparatus for testing an operational speed of the semiconductor chip, comprising:

a timer for indicating a time interval;

an oscillator running at a test frequency;

a counter coupled to the oscillator, wherein the counter is incremented for each cycle of the oscillator during the time interval, wherein a faster semiconductor chip would result in more counts counted by the counter than a slower semiconductor chip;

a circuit coupled to the counter for determining the speed of the semiconductor chip based upon a count value stored in the counter, wherein a test value is loaded into the counter and a pass condition is indicated if the counter overflows at the end of the time interval; otherwise, a fail condition is indicated if the counter does not overflow at the end of the time interval and, wherein the test value is incrementally increased until the semiconductor chip fails the test.

* * * * *